(12) United States Patent
Kowkutla et al.

(10) Patent No.: US 11,663,111 B2
(45) Date of Patent: May 30, 2023

(54) INTEGRATED CIRCUIT WITH STATE MACHINE FOR PRE-BOOT SELF-TESTS

(71) Applicant: Texas Instruments Incorporated, Dallas, TX (US)

(72) Inventors: Venkateswar Reddy Kowkutla, Allen, TX (US); Rejitha Nair, Southlake, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 32 days.

(21) Appl. No.: 17/138,684

(22) Filed: Dec. 30, 2020

(65) Prior Publication Data

US 2021/0209003 A1 Jul. 8, 2021

Related U.S. Application Data

(60) Provisional application No. 62/956,446, filed on Jan. 2, 2020.

(51) Int. Cl.
*G06F 11/36* (2006.01)
*G01R 31/317* (2006.01)

(52) U.S. Cl.
CPC .... *G06F 11/3648* (2013.01); *G01R 31/31724* (2013.01); *G06F 11/3672* (2013.01)

(58) Field of Classification Search
CPC ............. G06F 11/3648; G06F 11/3672; G06F 11/1417; G01R 31/31724

USPC ......................................................... 714/733
See application file for complete search history.

(56) References Cited

U.S. PATENT DOCUMENTS

| | | | |
|---|---|---|---|
| 8,677,306 B1* | 3/2014 | Andreev | G06F 11/267 714/39 |
| 9,367,327 B2* | 6/2016 | Swanson | G06F 21/575 |
| 2008/0077800 A1* | 3/2008 | Wang | G06F 21/575 713/187 |
| 2012/0173922 A1* | 7/2012 | Cheng | G06F 11/2025 714/13 |
| 2015/0199201 A1* | 7/2015 | Lim | G06F 11/073 713/2 |
| 2016/0117176 A1* | 4/2016 | Gillon | G06F 9/4403 713/2 |
| 2018/0074884 A1* | 3/2018 | Cady | G06F 11/0787 |
| 2019/0278677 A1* | 9/2019 | Terechko | G06F 11/2236 |

* cited by examiner

*Primary Examiner* — James C Kerveros
(74) *Attorney, Agent, or Firm* — Mandy Barsilai Fernandez; Frank D. Cimino

(57) ABSTRACT

An integrated circuit includes a processor core configured to perform boot operations; and a microcontroller coupled to a processor core. The microcontroller includes: a set of microcontroller components; and a state machine coupled to the set of microcontroller components. The state machine is configured to perform self-test operations on the set of microcontroller components before the boot operations.

22 Claims, 14 Drawing Sheets

INTEGRATED CIRCUIT WITH STATE MACHINE FOR PRE-BOOT SELF-TESTS

CROSS-REFERENCE TO RELATED APPLICATION

This application claims priority to U.S. Provisional Application No. 62/956,446 filed Jan. 2, 2020, which is hereby incorporated by reference in its entirety.

BACKGROUND

As new electronic devices are developed and integrated circuit (IC) technology advances, new IC products are commercialized. One example IC product for electronic devices is a system-on-a-chip (SoC) with at least one processor core and memory for executing applications. To improve reliability, ICs include may perform software-based debugger and self-test operations. However, software-based debugger and self-test operations are subject to errors in IC hardware.

SUMMARY

In at least one example, an integrated circuit (IC) comprises: a processor core configured to perform boot operations; and a microcontroller coupled to a processor core. The microcontroller includes: a set of microcontroller components; and a state machine coupled to the set of microcontroller components. The state machine is configured to perform self-test operations on the set of microcontroller components before the boot operations.

In another example, a system comprises: an integrated circuit (IC) having: a terminal adapted to be coupled to a peripheral component; a processor core configured to perform boot operations; and a microcontroller coupled to a processor core. The microcontroller includes: a set of microcontroller components; and a state machine coupled to the set of microcontroller components. The state machine is configured to perform self-test operations on the set of microcontroller components before the boot operations.

In yet another example, a method comprises: receiving, by a microcontroller of an IC, a power supply signal; and initiating, by the microcontroller, a microcontroller self-test using a state machine responsive to the received power supply signal. The method also comprises: initiating, by a processor core of the IC, first boot operations responsive to the microcontroller self-test being completed successfully; and initiating, by the processor core, second boot operations responsive to the microcontroller self-test not being completed successfully.

DETAILED DESCRIPTION

In this description, an integrated circuit (IC) includes a processor core to execute applications. In some example embodiments, the IC is an infotainment chip with at least one processor core or system-on-a-chip (SoC) portion. Applications executed by an SoC portion of an infotainment chip are used to perform sensor data analysis, generate safety alerts, and/or perform video/messaging in a vehicle with a display. Other ICs with an SoC portion include industrial ICs for use factory automation, aerospace, defense, or other application. Applications executed by an SoC portion of an industrial chip are used to perform sensor data analysis, generate safety alerts, and/or perform video/messaging in an industrial setting with a display or network.

In addition to the SoC portion, example ICs include a microcontroller (MCU). In some example embodiments, the MCU is configured to handle safety alerts generated by the SoC portion. In addition to the SoC portion and MCU, example ICs include wakeup circuitry. In some example embodiments, the wakeup circuitry is configured to manage wakeup/sleep triggers of the IC.

In the described embodiments, the MCU and/or wakeup circuitry includes a state machine configured to perform pre-boot self-test operations of the MCU and wakeup circuitry. Use of one or more state machines for this purpose ensures that components and configuration data of the MCU and wakeup circuitry are correct without relying on the SoC. Once the state machine self-test operations are complete, the SoC boots in a normal mode or a safe mode (or fail-safe mode) depending on the results of the self-tests. In this manner, reliability of the IC is improved over ICs that rely on software self-test techniques.

Figure 1:
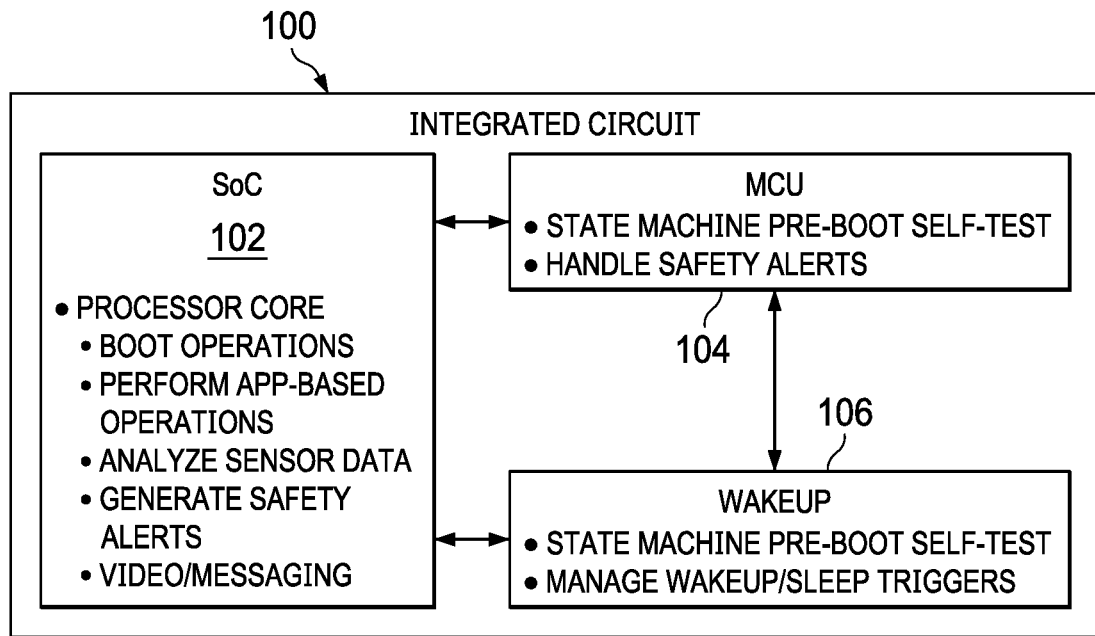
FIG. 1 is a block diagram of an integrated circuit (IC) in accordance with an example embodiment.

FIG. 1 is a block diagram of an IC 100 in accordance with an example embodiment. The IC 100 includes an SoC 102 coupled to an MCU 104 and wakeup circuitry 106. In the example of FIG. 1, the SoC 102 includes a processor core configured to perform operations such as boot operations, application-based operations, sensor data analysis, safety alert generation, and video/messaging operations. In one example, the processor core of the SoC 102 is configured to execute infotainment and advanced driver assistance system (ADAS) applications. In another example, the processor core is configured to execute industrial applications or other applications, such as factory automation, aerospace and defense, or electric grids.

The MCU 104 includes a state machine to perform pre-boot self-test operations on a set of MCU components. In some example embodiments, the set of MCU components include a memory controller and ARM processors, controller area network (CAN) modules, Ethernet, analog-to-digital converters ADCs, and/or a flash controller. In one example, the MCU 104 handles safety alerts generated by the SoC 102 after pre-boot and boot operations are complete.

As shown, the wakeup circuitry 106 includes a state machine to perform pre-boot self-test operations of a set of wakeup circuitry components. In other example embodiments, the MCU 104 and wakeup circuitry 106 share a single state machine for pre-boot self-test operations. In some example embodiments, the set of wakeup circuitry components include memory mapped registers and security controller, phase-locked loops (PLLs), oscillators, voltage monitors, reset generators. In one example, the wakeup circuitry 106 manages wakeup/sleep triggers of the IC 100 after pre-boot and boot operations are complete.

Figure 2:
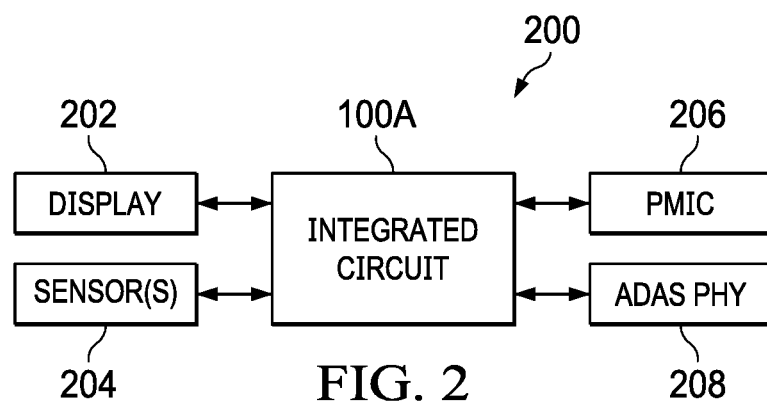
FIG. 2 is a schematic diagram of a system in accordance with an example embodiment.

FIG. 2 is a schematic diagram of a system 200 in accordance with an example embodiment. In some example embodiments, the system 200 is part of a vehicle's electrical system. As shown, the system 200 includes an integrated circuit 100A (an example of the integrated circuit 100 in FIG. 1) coupled to a display 202, sensor(s) 204, a power management IC (PMIC) 206. In some example embodiments, system 200 also includes an advanced driver assistance system (ADAS) physical (PHY) layer interface 208, which supports communications with ADAS applications or related components. In other example embodiments, system 200 is part of an industrial system (e.g., a factory setting with monitored equipment). In such case, the ADAS PHY layer interface 208 is omitted or is replaced with another interface. With the integrated circuit 100A, the functionality and configuration data of MCU components (e.g., components of the MCU 104 in FIG. 1) and/or wakeup circuitry components (e.g., components of the wakeup circuitry 106 in FIG. 1) of an IC (e.g., the IC 100 in FIG. 1, of the IC 100A in FIG. 2) are checked using state machine pre-boot self-tests. If the self-tests are successful, an SoC (e.g., the SoC 102 in FIG. 1) boots using a normal mode. If one or more of the self-tests are not successful, the SoC boots using a safe mode. The safe mode allows the device to boot-up to a predefined state to allow debug. In an example safe mode, an MCU boot read-only memory (ROM) will revert to a limited set of boot options, which rely strictly on MCU resources only. A customer boot loader can then take the appropriate custom action depending on their system.

Figure 3A:
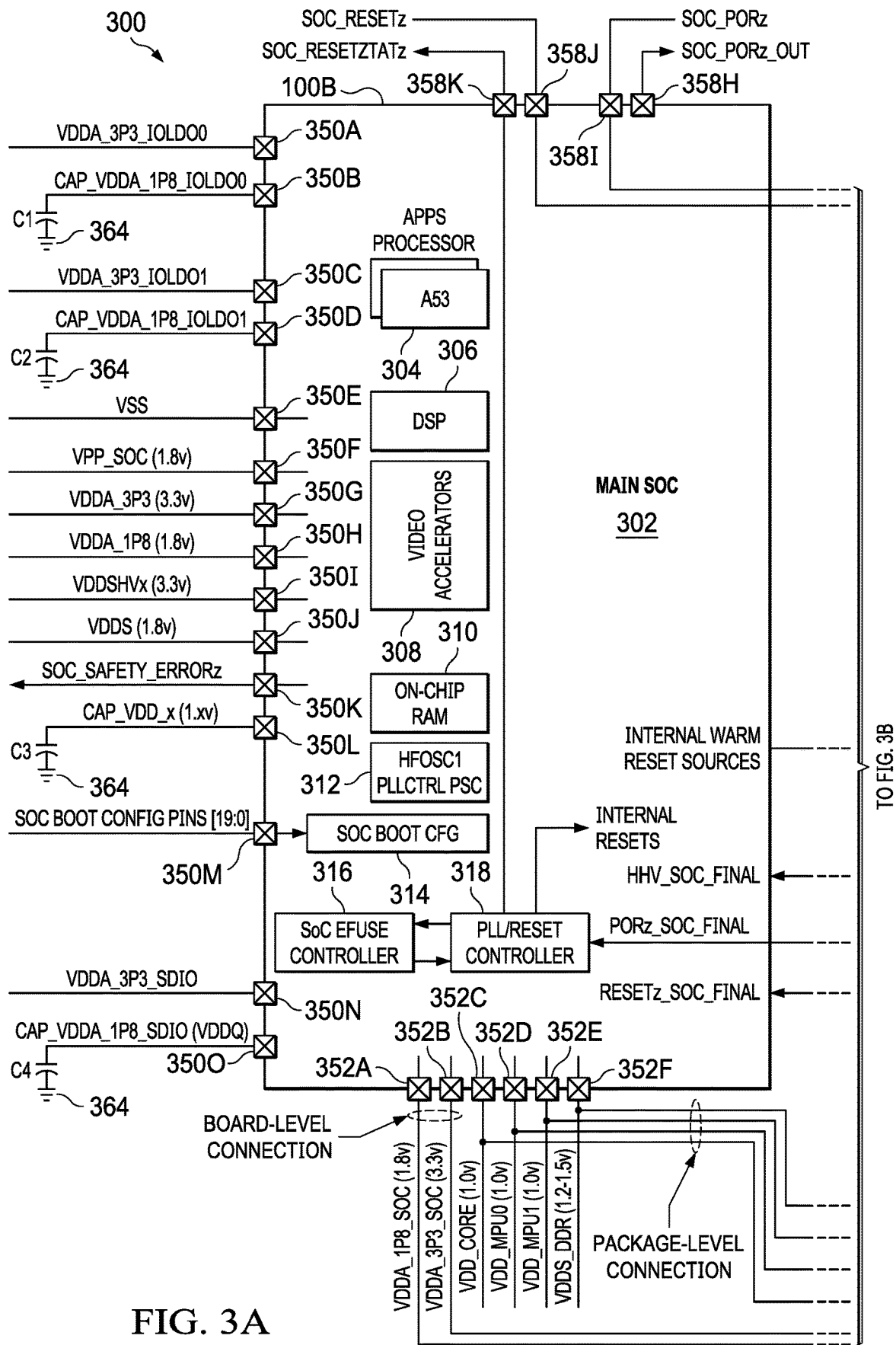
FIGS. 3A-3C is a diagram of an IC and related circuitry in accordance with an example embodiment.
Figure 3B:
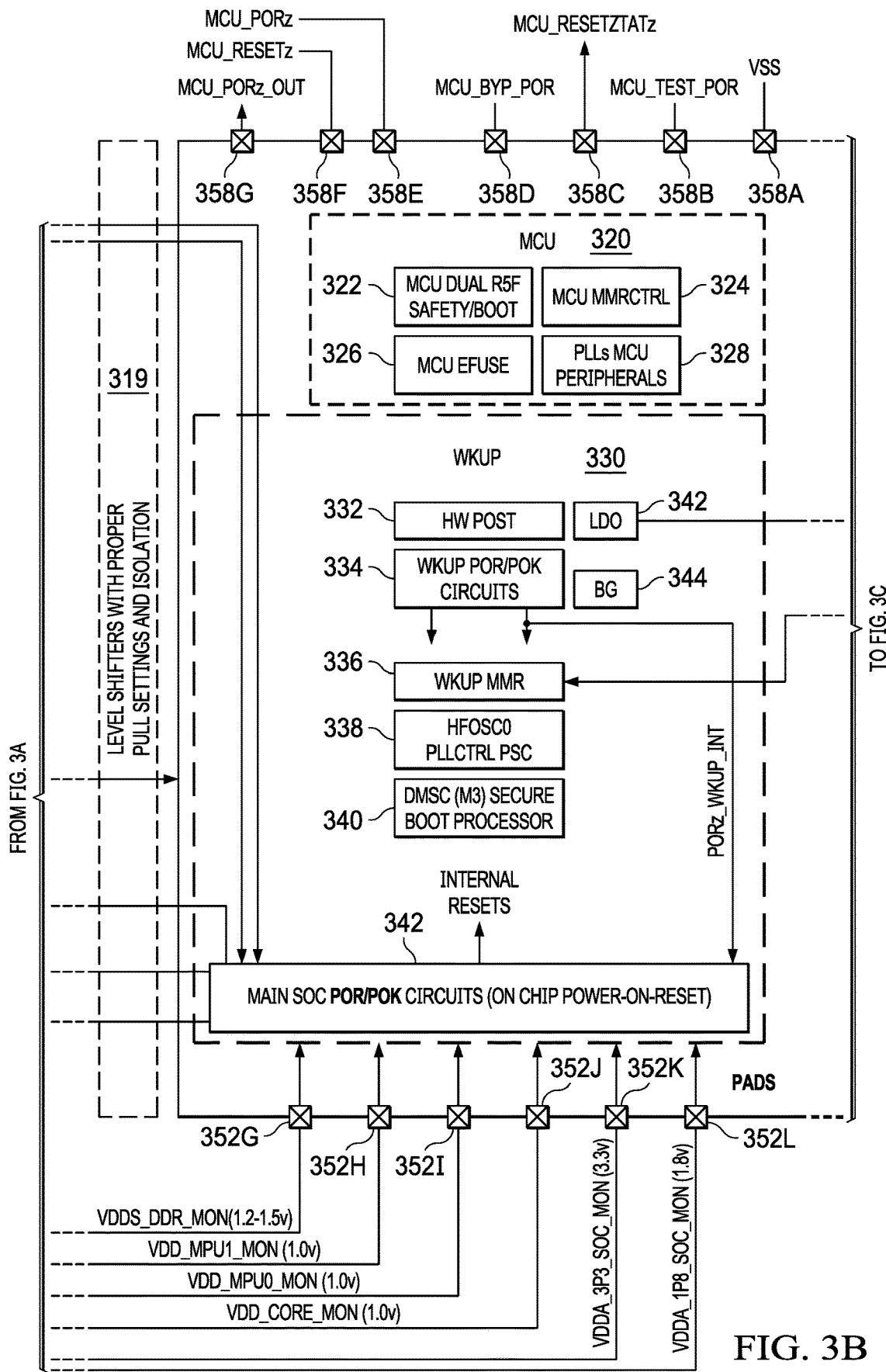
Figure 3C:
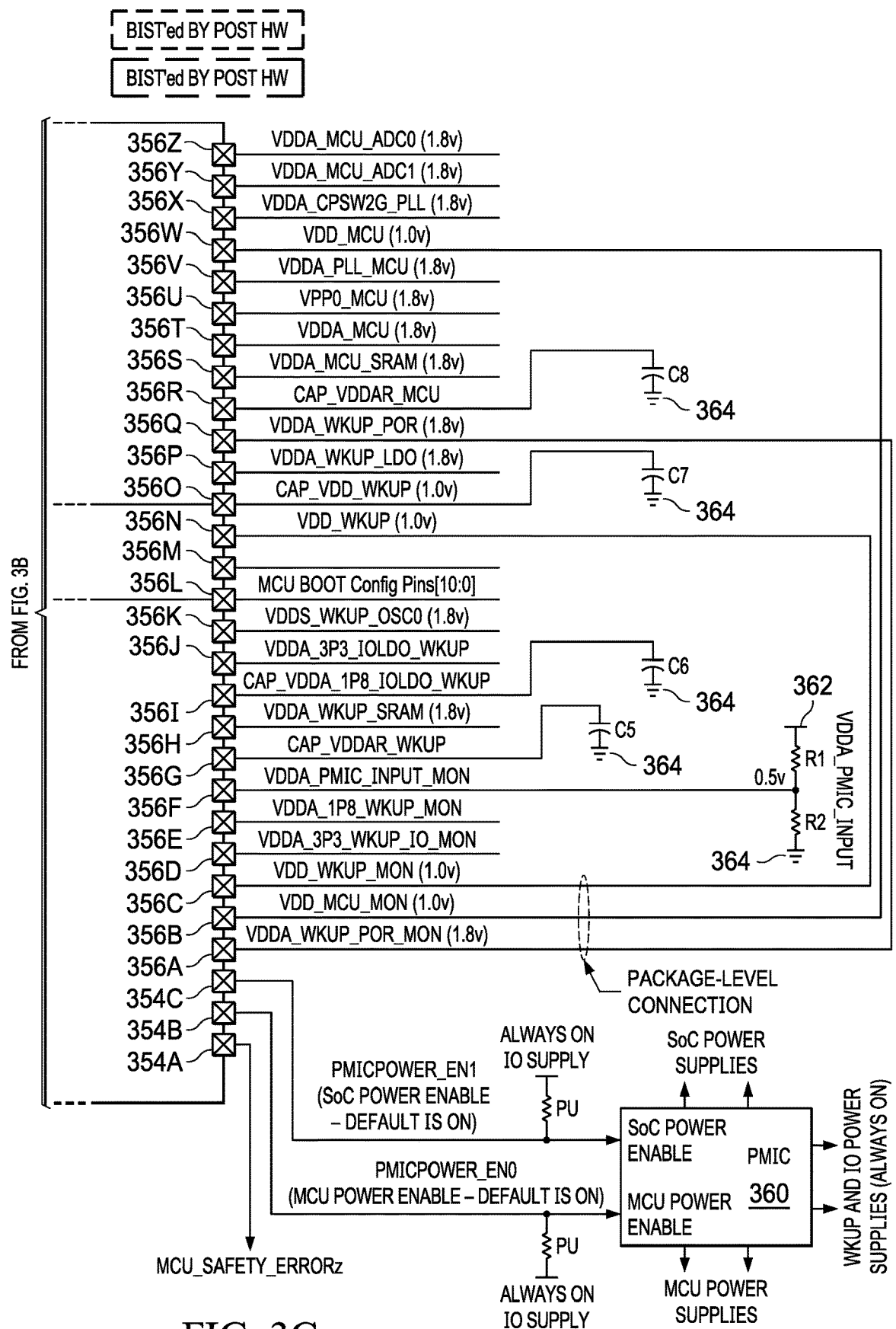

FIGS. 3A-3C together are a diagram 300 of an integrated circuit 302 (an example of the IC 100 in FIG. 1, or the IC 100A in FIG. 2) and related circuitry in accordance with an example embodiment. As shown, the integrated circuit 100B includes an SoC 302 (labeled main SoC), where the SoC 302 is an example of the SoC 102 in FIG. 1. The integrated circuit 100N also includes an MCU 320 (an example of the MCU 104 in FIG. 1) and wakeup circuitry 330 (an example of the wakeup circuitry 106 in FIG. 1). In the example of FIG. 3, the SoC 302 is separated from the MCU 320 and the wakeup circuitry 330 by level shifters 319.

In some example embodiments, the MCU 320 includes a set of microcontroller components subject to pre-boot self-test operations of a state machine 332 as described herein. Example components of the MCU 320 that are subject to pre-boot self-tests by the state machine 332 include: a memory controller; processor cores (e.g., safety processors and associated cache memories); an interrupt controller; an Ethernet controller; communication interfaces (e.g., SPI/I2C/UART); analog-to-digital converters (ADCs); a flash controller; and a bus network. Similarly, the wakeup circuitry 330 includes a set of wakeup circuitry components subject to pre-boot self-test operations of the state machine 332 as described herein. Example components of the wakeup circuitry 330 that are subject to pre-boot self-tests by the state machine 332 include: memory mapped registers; processor cores (e.g., a security processor and associated memories); an interrupt controller; a bus network; phase-locked loops (PLLs); oscillators; communication interfaces (e.g., I2C/UART); voltage monitors (e.g., SoC boot voltage monitors); and/or PLL controllers. Without limitation, in some example embodiments, self-test operations of MCU components and/or wakeup circuitry components include: a logic gate self-test; a memory cell self-test; and/or a processor self-test. In another example embodiment, self-test operations of MCU components and/or wakeup circuitry components include: a logic gate self-test; a memory cell self-test; a clock self-test; a reset control self-test; a bus network self-test; and an interrupt controller self-test.

In the example of FIGS. 3A-3C, the SoC 302 includes processors 304, a digital signal processor (DSP) 306, video accelerators 308, on-chip random-access memory (RAM) 310, a controller 312 with a high-frequency oscillator (HFOSC1), a phase-locked loop controller (PLLCTRL), and a power sleep controller (PSC). As shown, the SoC 302 also includes a SoC boot configuration block 314, a SoC eFuse controller 316, and a PLL/reset controller 318.

In the example of FIGS. 3A-3C, the MCU 320 includes a safety/boot controller 322 (labeled MCU dual R5F safety/boot). To perform pre-boot self-tests, the state machine 332 (labeled HW POST) is shared by the MCU 320 and the wakeup circuitry 330, even though separate BIST controllers (e.g., the safety/boot controller 322 of the MCU 320 and a controller 340 of the wakeup circuitry 330) may be used. The MCU 320 also includes a mapped memory register controller (MMRCTRL) 324, an eFuse controller 326, and MCU peripherals 328. In some example embodiments, the state machine 332 is configured to perform pre-boot self-test operations for the dual R5 cores, cache memories, tightly-coupled memories (TCMs), and shared on-chip memory. The MCU 320 is responsible for booting-up customer boot code and safety code.

In the example of FIGS. 3A-3C, the wakeup circuitry 330 includes the state machine 332 to perform pre-boot self-test operations. The wakeup circuitry 330 also includes power on reset (POR) and power OK (POK) circuitry 334, MMRs 336, and a controller 338 with a high-frequency oscillator (HFOSC0), a phase-locked loop controller (PLLCTRL), and PSC. In addition, the wakeup circuitry 330 includes a device management and security controller (DMSC) 340 with a secure boot processor (M3). Further, the wakeup circuitry 330 includes main SoC POR/POK circuitry 342. In some example embodiments, the state machine 332 performs pre-boot self-test operations to test a processor core (e.g., M3) and associated internal memories. The DMSC 340 is responsible for authenticating the boot code and maintaining security keys.

As shown, the IC 100B also includes various pins (terminals) 350A-350O, 352A-352L, 354A-354C, 356A-356Z, and 358A-358K. More specifically, the pins 350A-350D, 350F-350J, 350L, 350N, 352A-352L, 356A-356K, and 356M-356Z are different power supply (e.g., 1.8V, 3.3V, or other voltages) pins for different components of the IC 1006. As shown, some of the power supply pins are coupled to capacitors (e.g., C1-C8), including pins 350B, 350D, 350L, 350O, 356G, 356I, and 356O. More specifically, C1 is coupled between the pin 350B and a ground 364. C2 is coupled between the pin 350D and the ground 364. C3 is coupled between pin 350L and the ground 364. C4 is coupled between pin 350O and the ground. C5 is coupled between pin 356G and the ground 364. C6 is coupled between pin 356I and the ground 364. C7 is coupled between pin 356O and the ground 364. C8 is coupled between pin 356R and the ground 364. As shown, the IC 100B also includes ground (VSS) pins 350E and 358A. As shown, pin 356F is coupled to: a power supply terminal 362 via R1; and to the ground 364 via R2.

In the example of FIGS. 3A-3C, pin 350K is a safety error (SOC_SAFETY_ERRORz) pin. Pin 350L is a SoC configuration pin (SoC BOOT Config Pins[19:0]). Pin 354A is a safety error pin (MCU_SAFETY_ERRORz). Pin 354B is an MCU enable pin (PMICPOWER_EN0). Pin 354C is an SoC enable pin (PMICPOWER_EN1). Pin 356L is an MCU configuration pin (MCU BOOT Config Pins[10:0]). Pin 358B is an MCU test pin (MCU_TEST_POR). Pin 358C is an MCU reset pin (MCU_RESETZTATz). Pin 358D is an MCU bypass pin (MCU_BYP_POR). Pin 358D is an MCU bypass pin (MCU_BYP_POR). Pin 358E is an MCU power on reset pin (MCU_PORz). Pin 358F is an MCU reset pin (MCU_RESETz). Pin 358G is an MCU power on reset output pin (MCU_PORz_OUT). Pin 358H is an SoC power on reset output pin (SOC_PORz_OUT). Pin 358I is an SoC power on reset pin (SOC_PORz). Pin 358J is an SOC reset pin (SOC_RESETz). Pin 358K is an SOC reset output pin (SOC_RESETZTATz). The MCU_SAFETY_ERRORz pin is used to indicate any internal safety related errors to an external device (a secondary microcontroller or a power management IC) to take further action. If the device does not recover, the external device will issue a chip power on reset using MCU_PORz.

In the example of FIGS. 3A-3C, the IC 100B is coupled to a PMIC 360 that is configured to provide SoC and MCU power supplies for use by the IC 100B. The PMIC 360 is also configured to provide wakeup and I/O power supplies for use by the IC 100B. As shown, the PMIC 360 also includes an SoC power enable input coupled to pin 354C of the IC 1006. In addition, the PMIC 360 includes an MCU power enable input coupled to the pin 354B. In the example of FIGS. 3A-3C, the default states of the SoC power enable signal and the MCU power enable signal is ON. The default state is provide using power supply terminals and pull-up (PU) resistors coupled to the SoC and MCU power enable inputs.

In the example of FIGS. 3A-3C, the IC 100B includes two PMICPOWER_EN control signals: PMICPOWER_EN0 and PMICPOWER_EN1. PMICPOWER_EN0 controls power to MCU power rails. There is also an external pull-up, which is powered by an always on IO supply to turn on the supplies to the MCU 320 by default. After MCU_PORz is released, hardware logic (based on DMSC MMR bit) will drive an asserted signal on the PMICPOWER_EN0 pin to keep the supplies on at power-up. Later, for lower-power mode operations (e.g., a deeper sleep mode), the DMSC 340 can program its PMIC_EN MMR to power off MCU domain supplies. PMICPOWER_EN1 controls power to the SoC power rails. There is an external pull-up, which is powered by an always on IO supply to turn on the supplies to the SoC 302 by default. After MCU_PORz is released, hardware logic (based on WKUP CTRL MMR bit) will drive an asserted signal on the PMICPOWER_EN1 pin to keep the supplies on at power-up. Later, for lower-power mode operations (e.g., a deeper sleep mode), the DMSC 340 can program its WKUP CONTRL MMR bit (PMIC_PWR_EN1) to power off MCU domain supplies.

Figure 4:
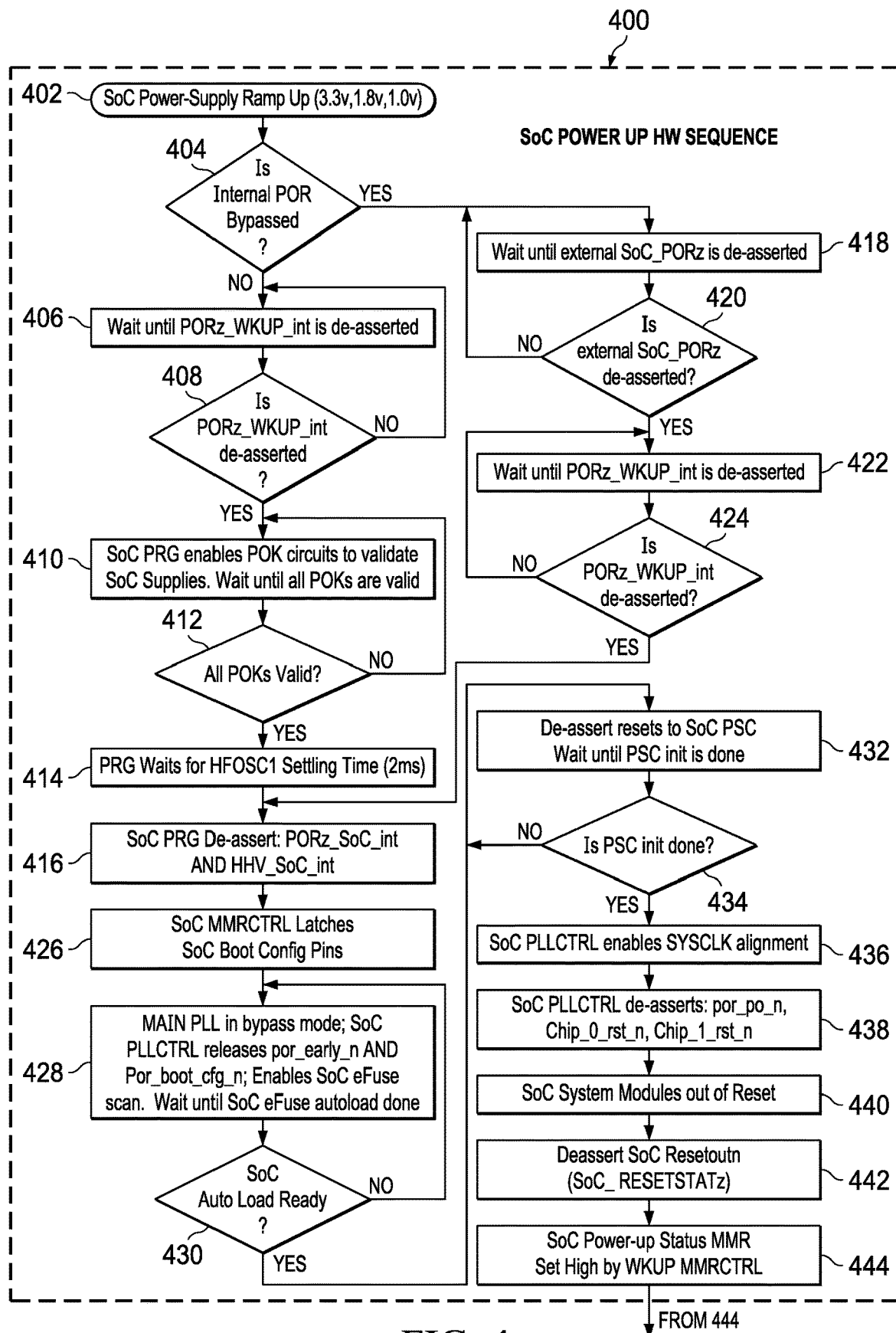
FIG. 4 is a flowchart of a system-on-a-chip (SoC) power-up hardware method in accordance with an example embodiment.

FIG. 4 is a flowchart of an SoC power-up hardware method 400 in accordance with an example embodiment. As shown, the method 400 includes an SoC power supply ramping up (e.g., 3.3V, 1.8V, 1.0V) at block 402. If an internal power on reset (POR) is bypassed (determination block 404), the method 400 waits at block 418 until an SoC power on reset signal (SOC_PORz) is de-asserted (determination block 420). The method 400 then waits at block 422 until a power on reset wakeup interrupt signal (PORz_WK-UP_int) is de-asserted (determination block 424) before proceeding to SoC operations (SoC PRG) to de-assert a power on reset SoC interrupt signals (PORz_SOC_int and HHV_SOC_int) at block 416.

Returning to determination block 404, if the internal POR is bypassed, the method 400 waits at block 406 until the power on reset wakeup interrupt signal (PORz_WKUP_int) is de-asserted (determination block 408). Once PORz_WKUP_int is de-asserted (determination block 408), SoC operations (SoC PRG) enable power OK (POK) circuits to validate SoC power supplies and to wait at block 410 until all POKs are valid (determination block 412). Once all POKs are valid (determination block 412), the SoC operations (SoC PRG) waits for HFOSC1 to settle (e.g., 2 ms) at block 414 before proceed to block 416, where the power on reset SoC interrupt signals (PORz_SOC_int and HHV_SOC_int) are de-asserted. At block 426, an SoC MMR controller (SOC MMRCTRL, part of controller 314 in FIG. 3A) latches SoC boot configuration pins. At block 428, while a main PLL is in bypass mode, an SoC PLL controller (PLLCTRL, part of the PLL/RESERT controller 318 in FIG. 3A): releases a power on reset early signal (por_early_n); releases a power on reset boot configuration signal (Por_boot_cfg_n); enables an SoC eFuse scan; and waits at block 428 until an SoC eFuse autoload is ready (determination block 430).

At block 432, resets are de-asserted to the SoC PSC (part of the controller 314 in FIG. 3A), and the method 400 waits at block 432 until PSC initialization is done (determination block 434). At block 436, the SoC PLLCTRL enables a system clock (SYSCLK) alignment. At block 438, the SoC PLLCTRL de-asserts various signals including: a power on reset signal (por_po_n); a first chip reset signal (Chip_0_rst_n) corresponding to a first set of SoC modules; and a second chip reset signal (Chip_1_rst_n) corresponding to a second set of SoC modules. At block 440, the SoC resets all of its modules using the first and second chip reset signals. At block 442, an SoC reset output signal (SOC_RESERTSTATz) is de-asserted. At block 444, the SoC power-up status MMR is set high by a wakeup MMR controller (e.g., WKUP MMR 336 in FIG. 3B).

Figure 5:
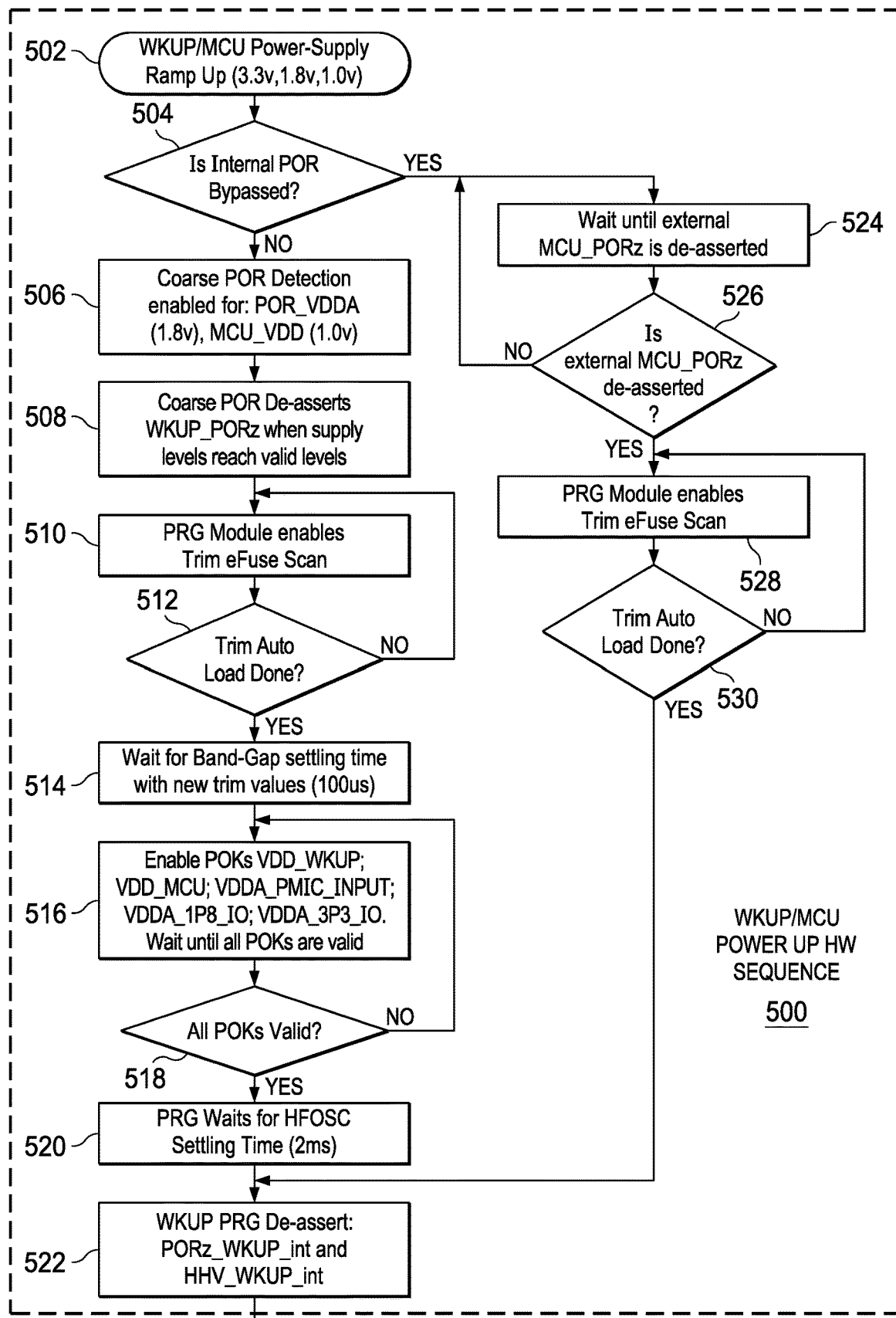
FIG. 5 is a flowchart of a wakeup circuitry and microcontroller power-up hardware method in accordance with an example embodiment.

FIG. 5 is a flowchart of wakeup circuitry and microcontroller power-up hardware method 500 in accordance with an example embodiment. As shown, the method 500 includes the power supply for wakeup circuitry (e.g., the wakeup circuitry 106 in FIG. 1, or the wakeup circuitry 330 in FIG. 3B) and an MCU (e.g., the MCU 104 in FIG. 1, or the MCU 320 in FIG. 3B) ramping up at block 502. If an internal power on reset (POR) is bypassed (determination block 504), the method 500 waits at block 524 until an external MCU power on reset signal (MCU_PORz) is de-asserted (determination block 526). At block 528, a trim eFuse scan is enabled (e.g., by a programmable (PRG) module such as WKUP POR/POK circuits 334 in FIG. 3B) until a trim auto load is done (determination block 530). After the trim auto load is done (determination block 530), a power on reset wakeup interrupt signals (PORz_WKUP_int and HHV_WKUP_int) are de-asserted by wakeup circuitry (e.g., WKUP PRG such as WKUP POR/POK circuits 334 in FIG. 3B) at block 522. The HHV_WKUP_int signal is used to reset input/output buffers and analog modules.

Returning to determination block 504, if the internal POR is not bypassed, the method 500 enable coarse POR detection for power supply signals (e.g., POR_VDDA and MCU_VDD) at block 506. At block 508, the coarse POR de-asserts a wakeup power on reset signal (WKUP_PORz) when power supply levels reach valid levels. At block 510, a trim eFuse scan is enabled (e.g., by the PRG module) at block 510 until a trim auto load is done (determination block 512). At block 514, the method 500 waits for a bandgap settling time (e.g., 100 us) with new trim values. At block 516, various power supply signals are enabled including: VDD_WKUP; VDD_MCU; VDDA_PMIC_INPUT; VDDA_1P8_IO; and VDDA_3P3_IO. The method 500 stays at block 516 until all POKs are valid (determination block 518). At block 520, the method 500 waits for high-frequency oscillator (HFOSC) settling time (e.g., 2 ms). At block 522, the wakeup program (WKUP PRG) de-asserts the power on reset wakeup interrupt signals (PORz_WKUP_int and the HHV_WKUP_int).

Figure 6A:
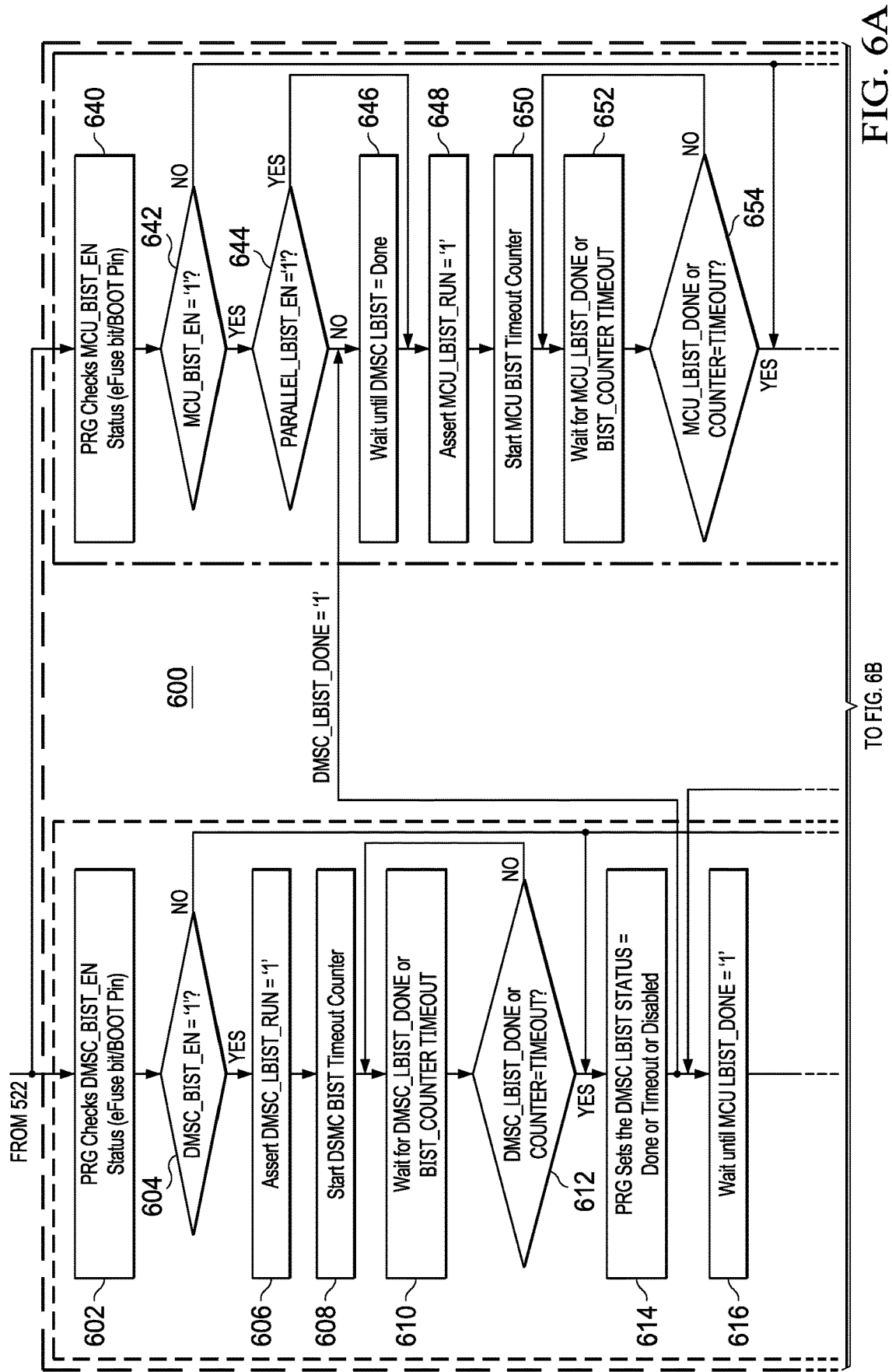
FIGS. 6A and 6B is a flowchart of state machine built-in self-test method in accordance with an example embodiment.
Figure 6B:
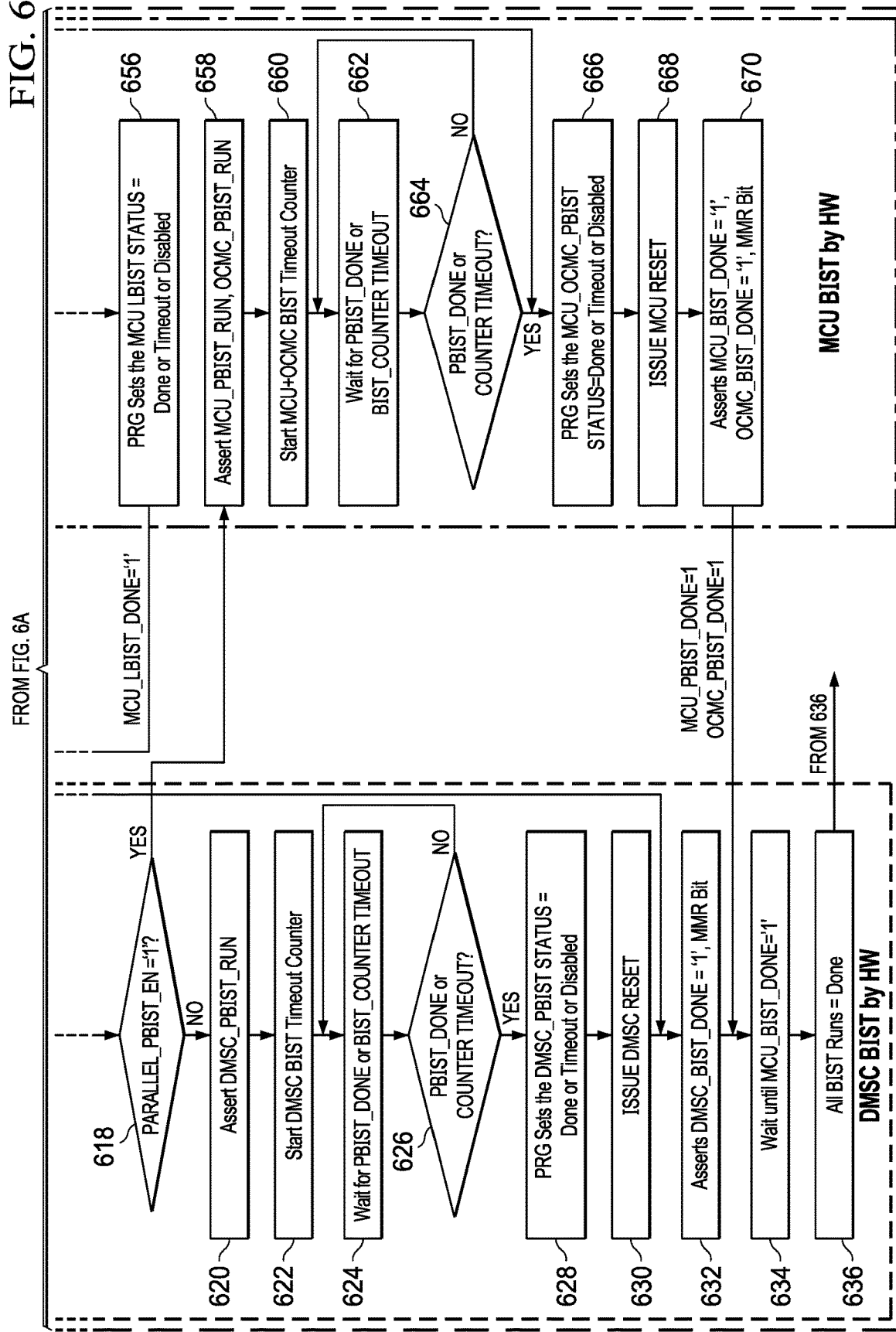

FIGS. 6A and 6B is a flowchart of state machine built-in self-test (BIST) method 600 in accordance with an example embodiment. In the example of FIGS. 6A and 6B, the method 600 includes pre-boot self-test operations (labeled "DMSC BIST by HW") of wakeup circuitry and pre-boot self-test operations (labeled "MCU BIST by HW") using state machines as described herein. As shown, the DMSC BIST by HW operations of the method 600 include checking the status of a self-test enable bit (DMSC_BIST_EN) at block 602. In some example embodiments, block 602 follows block 522 in FIG. 5. Also, in some example embodiments, block 602 involves checking an eFuse bit via a BOOT pin (e.g., BOOT Config pins 350M in FIG. 3A) to check the status of MDSC_BIST_EN. If DMSC_BIST_EN is not asserted or is not equal to '1' (determination block 604), the method 600 asserts an MMR bit DMSC_BIST_DONE (i.e., DMSC_BIST_DONE='1') at block 632. If DMSC_BIST_EN is asserted or is equal to '1' (determination block 604), the method 600 asserts a first wakeup circuitry self-test run signal (DMSC_LBIST_RUN='1') at block 606. At block 608, a first wakeup circuitry self-test timeout counter is started. At block 610, the method 600 waits until the first wakeup circuitry self-test is done (indicated by DMSC_LBIST_DONE) or the timeout counter reaches a timeout threshold (BIST_COUNTER TIMEOUT) (determination block 612). At block 614, the method 600 sets a first wakeup circuitry self-test status bit to done (DMSC LBIST STATUS=Done) or timeout or disabled. If DMSC LBIST status is set to Done (DMSC_LBIST_DONE="1") at DoAt block 616, the method 600 waits until an MCU self-test bit is set to done (MCU LBIST_DONE='1').

If a parallel self-test bit is enabled (PARALLEL_PBIST_EN='1') (determination block 618), the method 600 asserts an MCU self-test run bit (MCU_PBIST_RUN) and a self-test run bit (OCMC PBIST) at block 658. Otherwise, if the parallel self-test bit is not enabled (PARALLEL_PBIST_EN='0') (determination block 618), a second wakeup circuitry self-test bit (DMSC_PBIST_RUN) is asserted at block 620. At block 622, a timeout counter for the second wakeup circuitry self-test (DMSC PBIST) is started. The method 600 then waits at block 624 until the second wakeup circuitry self-test is done or the related timeout counter reaches a counter threshold (determination block 626). At block 628, a second wakeup circuitry self-test status bit (DMSC_PBIST STATUS) is set to done or timeout or disabled. At block 630, a wakeup circuitry reset (DMSC RSERT) is issued. At block 632, a wakeup circuitry self-test done bit is set (DMSC_BIST_DONE='1'). At block 634, the method 600 waits until an MCU self-test done bit is set (MCU_BIST_DONE='1').

In the example of FIGS. 6A and 6B, the MCU BIST by HW operations of the method 600 include checking an MCU self-test enable bit (MCU_BIST_EN) status at block 640. In some example embodiments, block 640 involves checking an eFuse bit via a BOOT pin (e.g., MCU BOOT Config pins 356L in FIG. 3C) to check the status of MCU_BIST_EN. If MCU_BIST_EN is de-asserted or is not set to '1' (determination block 642), the method 600: sets a first MCU self-test status bit (MCU LBIST STATUS) to done or timeout or disabled at block 656; and sets a second MCU self-test and OCMC self-test status bit (MCU_OCMC_PBIST STATUS) as done or timeout or disabled at block 666. If MCU_BIST_EN is asserted or is set to '1' (determination block 642), the method 600 checks if a parallel MCU self-test enable bit (PARALLEL_LBIST_EN) is asserted or is equal to '1' (determination block 644). If not, the method 600 waits at block 646 until a first wakeup circuitry self-test bit is set to done (DMSC LBIST=Done). If the parallel MCU self-test enable bit is asserted or is equal to '1' (determination block 644) or DMSC LBIST=Done at block 646, the method 600 asserts a first MCU self-test run bit (MCU_LBIST_RUN) to '1' at block 648. At block 650, an MCU self-test timeout counter is started. The method 600 then waits at block 652 for a first MCU self-test done bit (MCU_LBIST_DONE) or for the MCU self-test timeout counter reach a threshold (BIST_COUNTER TIMEOUT) (determination block 654). At block 656, a first MCU self-test status bit is set to done (MCU LBIST STATUS=Done) or timeout or disabled.

As shown, block 656 passes information (e.g., MCU_LBIST_DONE='1') to block 616. If a parallel self-test enable bit is asserted (PARALLEL_PBIST_EN='1') (determination block 618), the method 600 asserts MCU self-test run bits (MCU_PBIST_RUN and OCMC PBIST RUN). At block 660, related MCU self-test timeout counters are started. The method 600 then stays at block 662 until an MCU self-test done bit (PBIST_DONE) is asserted or a self-test timeout counter threshold (BIST_COUNTER TIMEOUT) is reached (determination block 664). As previously noted, the method 600 sets an MCU self-test status bit (MCU_OCMC_PBIST STATUS) as done or timeout or disabled at block 666. At block 668, an MCU reset is issued. At block 670, a second MCU self-test done MMR bit (MCU_BIST_DONE) an OCMC self-test done MMR bit (OCMC_BIST_DONE) are set to '1'. With MCU_BIST_DONE='1' and OCMC_BIST_DONE='1', the method 600 transitions from block 670 to block 634. At block 634, the method 600 waits until an MCU self-test done bit (MCU_BIST_DONE) is set to '1'. At block 636, all self-test runs are set to done.

Figure 7:
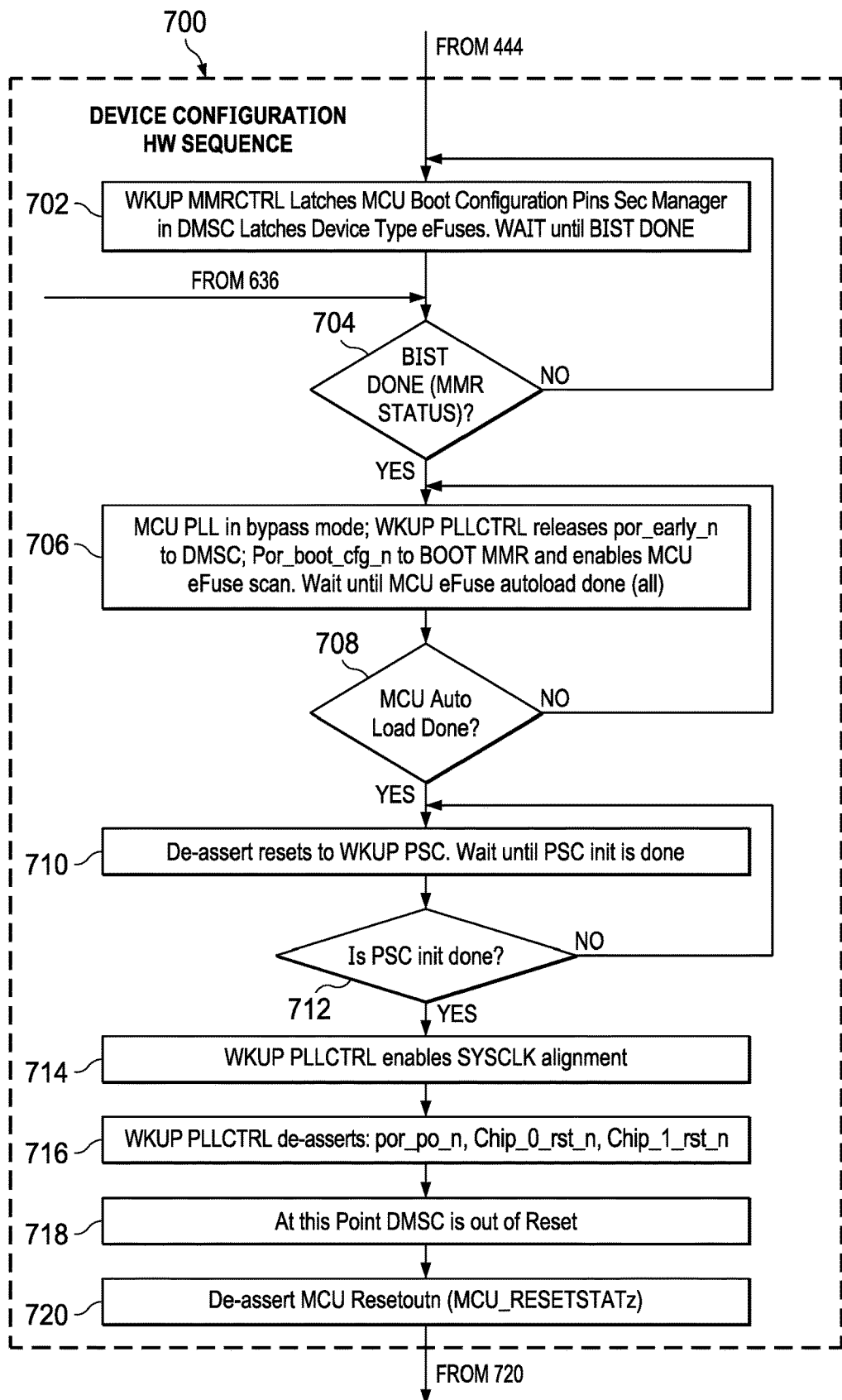
FIG. 7 is a flowchart of a device configuration hardware method in accordance with an example embodiment.

FIG. 7 is a flowchart of a device configuration hardware method 700 in accordance with an example embodiment. As shown, the method 700 includes: wakeup circuitry MMR controller (WKUP MMRCTRL, or WKUP MMR 336 in FIG. 3B) latching MCU BOOT configuration pins (e.g., MCU BOOT Config Pin [10:0] 356L in FIG. 3C); and a manager of the DMSC latching device type eFuses at block 702. The method 700 also waits at block 702 until self-tests are done (determination block 704). In some examples, the determination block 704 receives an indication that self-tests are done from block 636 of FIG. 6B. At block 706, an MCU PLL is in bypass mode; WKUP PLLCTRL releases power on reset early signal (por_early_n) to the DMSC 340; and a power on reset boot configuration signal (Por_boot_cfg_n)

is provided to a BOOT MMR (e.g., the WKUP MMR 336 in FIG. 3B); and MCU eFuse scans are enabled. Also, the method 700 waits at block 706 until an MCU eFuse auto load is done (determination block 708). At block 710, resets to a wakeup circuitry PSC (e.g., part of the controller 338 in FIG. 3B) are de-asserted. The method 700 also waits at block 710 until a PSC initialization is done (determination block 712). At block 714, the WKUP PLLCTRL enables a system clock (SYSCLK) alignment. At block 716, the WKUP PLLCTRL de-asserts various signals including: por_po_n; Chip_0_rst_n; and Chip_1_rst_n. At block 718, the DMSC (e.g., DMSC 340 in FIG. 3B) is no longer in reset, and an MCU reset output (MCU_RESETSTATz) is de-asserted at block 720

Figure 8:
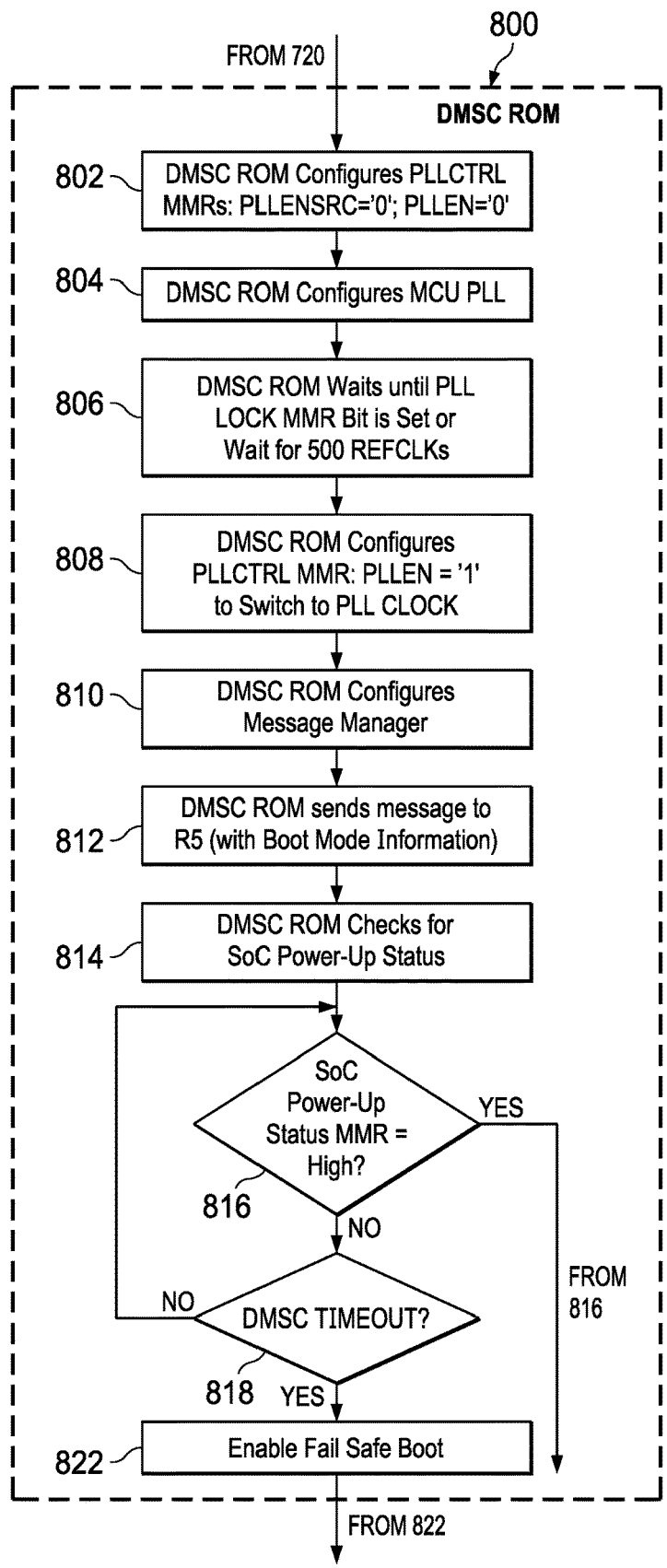
FIG. 8 is a flowchart of a state machine read-only memory (ROM) method in accordance with an example embodiment.

FIG. 8 is a flowchart of a state machine read-only memory (ROM) method 800 in accordance with an example embodiment. The method 800 is performed, for example, by the DMSC 340 of FIG. 3B. As shown, the method 800 includes a DSCM ROM configuring PLLCTRL MMRs (e.g., PLLENSRC='0' and PLLEN='0') at block 802. At block 804, a DMSC ROM configures the MCU PLL (e.g., the PLLs MCU peripherals 328 in FIG. 3B). At block 806, the DMSC ROM waits until a PLL LOCK MRR bit is set or a number of reference clock cycles (e.g., 500 RECLK cycles). At block 808, the DMSC ROM configures a PLLCTRL MMR (e.g., PLLEN='1') to switch to PLL clock. At block 810, the DMSC ROM configures a message manager. At block 812, the DMSC ROM sends a message to R5 with boot mode information. As used herein, R5 refers to a safety processor of the MCU 320 (e.g., part of the MCU dual R5F safety boot block 322). If an SoC power-up status MMR is high (determination block 816), the method 800 provides an YES output. If the SoC power-up status MMR is not high (determination block 816), the method 800 stays at determination block 816 until there is a DMSC timeout (determination block 818). At block 822, a safe boot is enabled.

Figure 9:
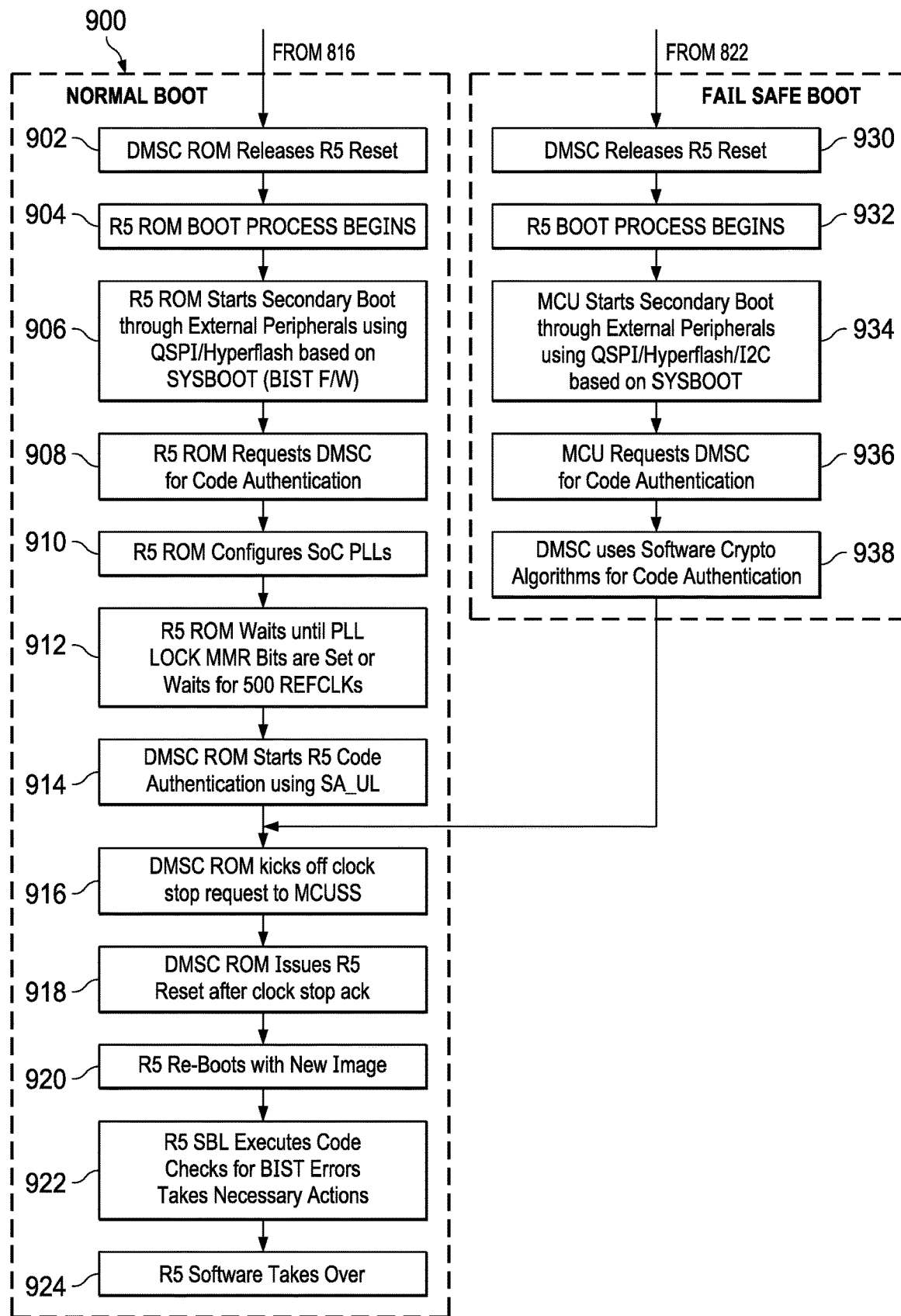
FIG. 9 is a flowchart of a boot method in accordance with an example embodiment.

FIG. 9 is a flowchart of a boot method 900 in accordance with an example embodiment. The method 900 is performed by an SoC (e.g., the SoC 102 in FIG. 1, or the SoC 302 in FIG. 3A). As shown, the method 900 includes normal boot operations and safe boot operations. The normal boot operations include a DMSC ROM releasing an R5 reset at block 902. In the example of FIG. 9, block 902 is connected to the YES output of determination block 816 in FIG. 8. At block 904, the R5 ROM boot process begins. At block 906, the R5 ROM starts a secondary boot through external peripherals using communication interfaces (e.g., QSP1/Hyperflash) based on a system boot (SYSBOOT) and self-test firmware (BIST F/W). At block 908, the R5 ROM request a code authentication from the DMSC 340. At block 910, the R5 ROM configures SoC PLLs. At block 912, the R5 ROM waits until PLL LOCK MMR bits are set or a number of reference clock cycles (e.g., 500 REFCLK cycles). At block 914, the DMSC ROM starts R5 code authentication using hardware security accelerators for security authentication, decryption and encryption (e.g., SA_UL). At block 916, the DMSC ROM initiates a stop request to MCUSS. At block 918, the DMSC ROM issues an R5 reset after a clock stop acknowledgement. At block 920, the R5 re-boots with a new image. At block 922, the R5 secondary boot loader (SBL) executes does check for self-check errors and takes necessary actions. At block 924, the R5 software takes over.

The safe boot operations of the method 900 include an DMSC (e.g., the DMSC 340 in FIG. 3B) releasing an R5 reset at block 930. At shown, block 930 is connected to block 822 of FIG. 8. At block 932, the R5 boot process begins. At block 934, the MCU starts secondary boot through external peripherals using communication interfaces (e.g., QSP1/Hyperflash) based on a system boot (SYSBOOT). At block 936, the MCU requests code authentication from the DMSC. At block 938, the DMSC uses software cryptographic algorithms for code authentication. As shown, the output of block 938 is connected to block 916.

Figure 10A:
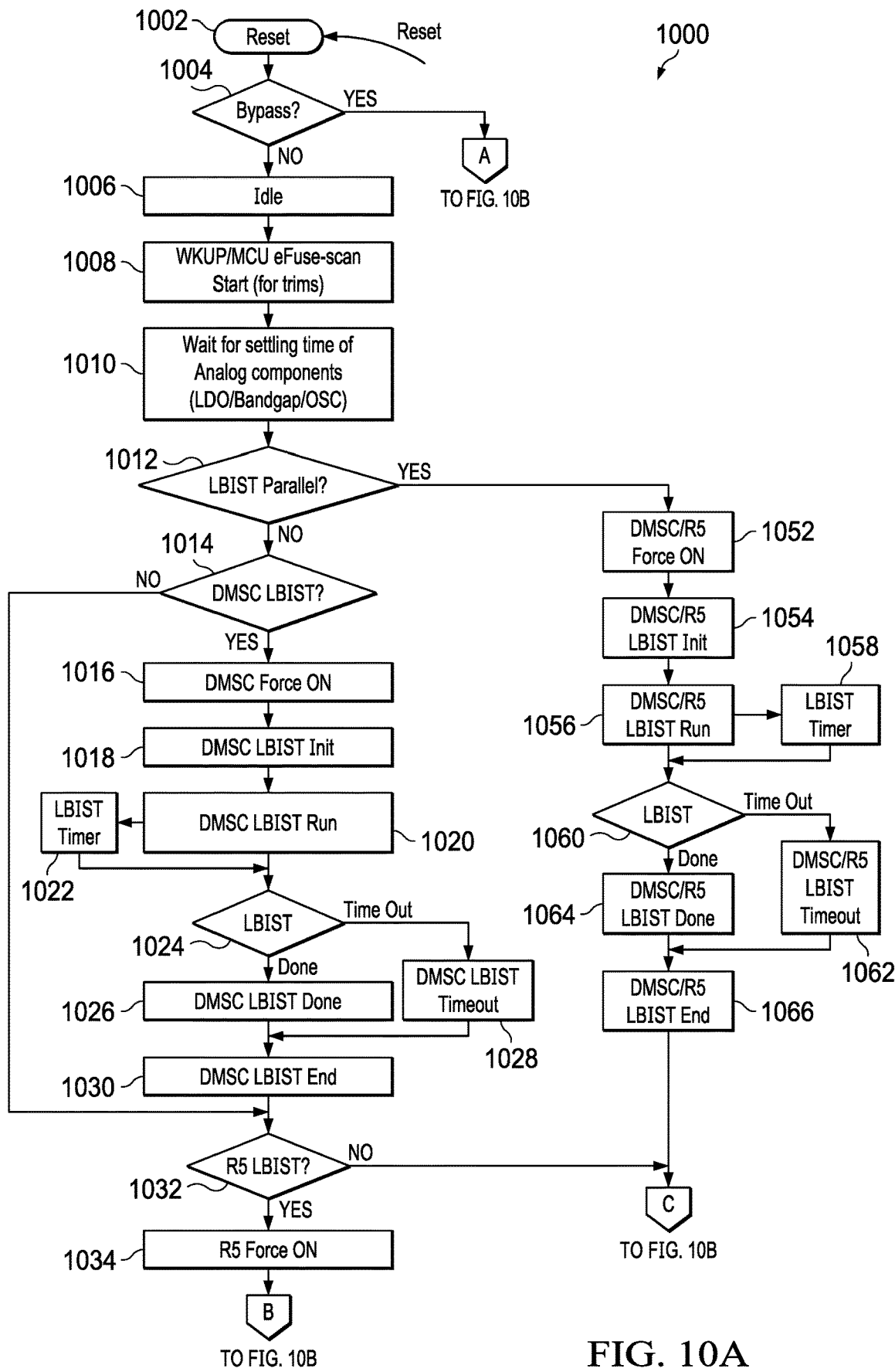
FIGS. 10A and 10B is a flowchart of a power-on self-test (POST) method in accordance with an example embodiment.
Figure 10B:
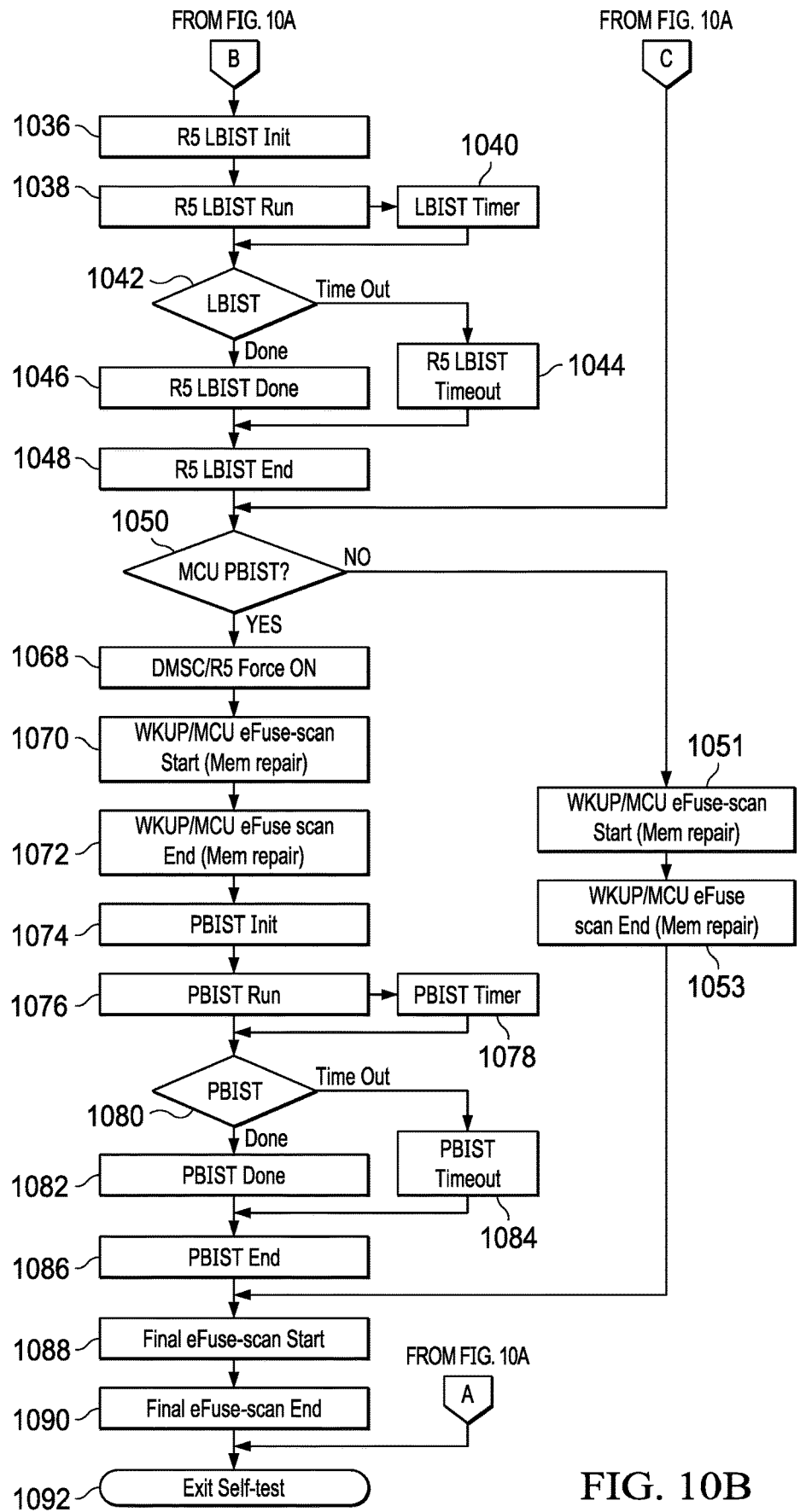

FIGS. 10A and 10B is a flowchart of a power-on self-test (POST) method 1000 in accordance with an example embodiment. The POST method 1000 is an example of pre-boot self-test operations for an IC (e.g., the IC 100 in FIG. 1, the IC 100A in FIG. 2, the IC 100B in FIGS. 3A-3C) as described herein. As shown, the method 1000 includes a reset at block 1002. If self-testing is bypassed (determination block 1004), the method 1000 exits the self-test. If the self-testing is not bypassed (determination block 1004), the method 1000 proceeds to an idle block 1006. At block 1008, wakeup circuitry and MCU eFuse scan operations are started (for trims). At block 1010, the method 1000 waits for a settling time of analog components (e.g., a low dropout regulator or "LDO", bandgap regulator, or oscillator). If parallel self-testing is to be performed (determination block 1012), the DMSC and R5 are forced ON at block 1052. At block 1054, first self-tests for the DMSC and R5 are initiated. At block 1056, DMSC and R5 self-tests run. At block 1058, a self-test timer is started. If the self-test is done (determination block 1060), the DMSC and R5 self-test done bits are set at block 1064. At block 1066, the DMSC and R5 self-tests ends. Returning to the determination block 1060, if the self-test times outs, then DMSC and R5 self-test timeout bits are set at block 1062. From block 1062, the method 1000 proceeds to block 1066.

If self-tests are not performed in parallel (determination block 1012), and DMSC self-tests are performed (determination block 1014), the method 1000 proceed to force the DMSC on at block 1016. At block 1018, the DMSC initiates self-tests. At block 1020, the DMSC runs self-tests. At block 1022, a self-test timer starts. If DMSC self-testing is done (determination block 1024), DMSC self-test done bits are set at block 1026. At block 1028, DMSC self-tests end. Returning to determination block 1024, if self-tests time out, the method 1000 sets DMSC self-test timeout bits at block 1028. After block 1028, the method 1000 proceeds to block 1030.

After block 1030 or if DMSC self-testing is not performed (determination block 1014), a determination is made regarding R5 self-testing is to be performed. If R5 self-testing is to be performed (determination block 1032), R5 is forced on at block 1034. At block 1036 R5 self-testing is initiated. At block 1038, R5 self-testing runs. At block 1040, an R5 self-test timer is started. If the R5 self-tests are done (determination block 1042), R5 self-test done bits are set at block 1046. At block 1048, R5 self-testing ends. If R5 self-testing times out (determination block 1042, R5 self-test timeout bits are sets at block 1044. After block 1044, R5 self-testing ends at block 1048.

After block 1048 or if R5 self-testing is not to be performed (determination block 1032), the method 1000 proceeds to determination block 1050. if MCU self-testing is to be performed (determination block 1050), DMSC and R5 are forced on at block 1068. At block 1070, wakeup circuitry and MCU eFuse scans (memory repair) are started. At block 1072, wakeup circuitry and MCU eFuse scans end. At block 1074, MCU self-testing is initiated. At block 1076, MCU self-testing runs. At block 1078, an MCU self-test timer is started. If the MCU self-tests are done (determination block 1080), MCU self-tests done bits are set at block 1082. At block 1084, MCU self-tests ends. At block 1088, final eFuse scans start. The method 1000 also proceed to block 1088 if MCU self-tests are not to be performed (determination block 1050). More specifically, wakeup circuitry and MCU eFuse scans are stated at block 1051 if MCU self-tests are not to be performed (determination block 1050). After block 1051, wakeup and MCU eFuse scan ends at block 1053. From block 1053, the method 1000 proceeds to block 1088. From block 1088, the final eFuse scans end at block 1090. From block 1090, self-tests exit at block 1092.

Figure 11:
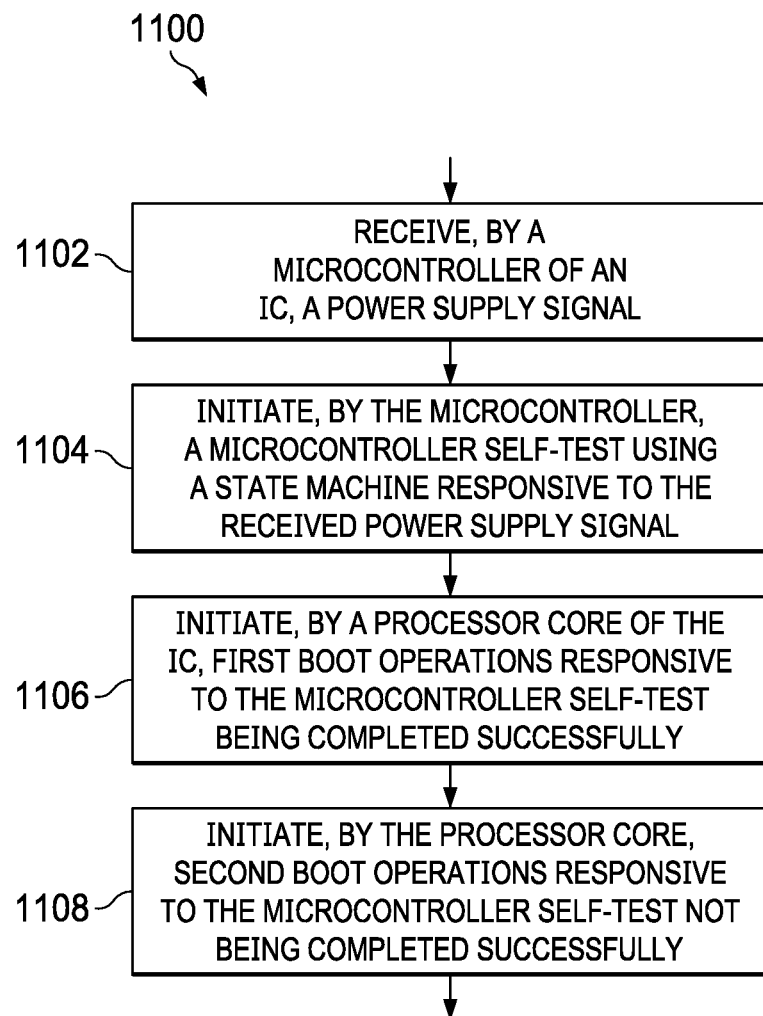
FIG. 11 is a flowchart of a IC power-up method in accordance with an example embodiment.

FIG. 11 is a flowchart of a IC power-up method 1100 in accordance with an example embodiment. The method 1100 is performed by an IC (e.g., the IC 100 in FIG. 1, the IC 100A in FIG. 2, or the IC 100B in FIGS. 3A-3C). As shown, the method 1100 includes receiving, by an MCU (e.g., MCU 104 in FIG. 1, or MCU 320 in FIG. 3B) of an IC, a power supply signal (e.g., one of the power supplies in FIG. 3 such as 3.3V, 1.8V, or 1.0V) at block 1102. At block 1104, an MCU self-test is initiated by the MCU, using a state machine responsive to the received power supply signal. At block 1106, first boot operations (e.g., a normal boot mode as in method 900 of FIG. 9) are initiated, by a processor core or related SoC of the IC, responsive to the MCU self-test being completed successfully. At block 1108, second boot operations (e.g., a safe boot mode as in method 900 of FIG. 9) are initiated, by the processor core or related SoC, responsive to the MCU self-test not being completed successfully.

In some example embodiments, the method 1100 additionally or alternatively includes receiving, by wakeup circuitry (e.g., wakeup circuitry 106 in FIG. 1, or wakeup circuitry 330 in FIG. 3B) of the IC, the power supply signal; initiating, by the wakeup circuitry, a wakeup circuitry self-test using a state machine responsive to the received power supply signal; initiating, by the processor core, first boot operations (e.g., a normal boot mode as in method 900 of FIG. 9) responsive to the microcontroller self-test and the wakeup circuitry self-test being completed successfully; and initiating, by the processor core, second boot operations (e.g., a safe boot mode as in method 900 of FIG. 9) responsive to the microcontroller self-test or the wakeup circuitry self-test not being completed successfully. In some example embodiments, the microcontroller self-test is performed in parallel with the wakeup circuitry self-test. In other example embodiments, the microcontroller self-test is performed after the wakeup circuitry self-test.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. An integrated circuit (IC) comprising:
a processor core configured to perform a boot operation; and
a controller coupled to the processor core, the controller comprising:
a first set of components; and
a state machine coupled to the first set of components, the state machine configured to perform a first self-test operation on a first component of the first set of components before the boot operation.

2. The IC of claim 1, wherein the first set of components include a memory controller, a safety processor and an associated cache memory, an interrupt controller, and a bus network.

3. The IC of claim 1, wherein the controller is configured to handle a safety alert of the IC after the first self-test operation and the boot operation are complete.

4. The IC of claim 1, further comprising a wakeup circuit coupled to the processor core and the controller, the wakeup circuit including a second set of components, the state machine coupled to the second set of components, and the state machine configured to perform a second self-test operation on a second component of the second set of components before the boot operation.

5. The IC of claim 4, wherein the second set of components include: memory mapped registers; a security processor and associated memory; an interrupt controller; and a bus network.

6. The IC of claim 4, wherein the wakeup circuit is configured to manage security, wake-up triggers, and sleep triggers of the IC after the boot operation is complete.

7. The IC of claim 1, wherein the processor core is configured to execute an infotainment application.

8. The IC of claim 1, wherein the state machine is configured to perform a first set of self-test operations to the first set of components, wherein the first set of self-test operations comprises the first self-test operation, and wherein the first set of self-test operations include: a logic gate self-test; a memory cell self-test; and a processor self-test.

9. The IC of claim 1, wherein the state machine is a hardware state machine.

10. A system comprising:
an integrated circuit (IC) having:
a terminal adapted to be coupled to a peripheral component;
a processor core configured to perform a boot operation; and
a controller coupled to the processor core, the controller comprising:
a first set of components; and
a state machine coupled to the first set of components, the state machine configured to perform a first self-test operation on a first component of the first set of components before the boot operation.

11. The system of claim 10, wherein the first set of components include: a memory controller; processor cores; an interrupt controller; a bus network; a flash controller; an Ethernet controller; a communications interface; and an analog-to-digital converter (ADC).

12. The system of claim 10, wherein the controller is configured to handle safety alerts of the IC after the boot operation is complete.

13. The system of claim 10, wherein the IC includes a wakeup circuit coupled to the processor core and the controller, the wakeup circuit including a second set of components, the state machine coupled to the second set of components, and the state machine configured to perform a second self-test operation on a second component of the second set of components before the boot operation.

14. The system of claim 13, wherein the second set of components include: memory mapped registers; processor cores; an interrupt controller; a bus network; phase-locked loops (PLLs); an oscillator; a communication interface, a voltage monitor; and a PLL controller.

15. The system of claim 13, wherein the wakeup circuit is configured to manage wake-up and sleep triggers of the IC after the boot operation is complete.

16. The system of claim 10, wherein the processor core is configured to execute an infotainment application.

17. The system of claim 10, wherein the state machine is configured to perform a first set of self-test operations to the first set of components, the first set of self-test operations comprises the first self-test operation, and wherein the first set of self-test operations include: a logic gate self-test; a memory cell self-test; a clock self-test; a reset control self-test; a bus network self-test; and an interrupt controller self-test.

18. The system of claim 10, wherein the peripheral component is a display coupled to the terminal.

19. A method, comprising:
receiving, by a controller of an integrated circuit (IC), a power supply signal, the controller including a first set of components and a state machine coupled to the first set of components;
in response to receiving the power supply signal, initiating, by the controller, a self-test on a first component of the first set of components using the state machine;
in response to the self-test on the first component being completed successfully, initiating, by a processor core of the IC, a first boot operation; and
in response to the self-test on the first component not being completed successfully, initiating, by the processor core, a second boot operation.

20. The method of claim 19, further comprising:
receiving, by a wakeup circuit of the IC, the power supply signal;
in response to receiving the power supply signal, initiating, by the wakeup circuit, a wakeup circuit self-test using the state machine, wherein initiating the first boot operation comprises initiating the first boot operation the wakeup circuit self-test and the self-test on the first component being completed successfully, and
wherein initiating the second boot operation comprises initiating the second boot operation in response to the wakeup circuit self-test or the self-test on the first component not being completed successfully.

21. The method of claim 20, wherein the self-test on the first component is performed in parallel with the wakeup circuit self-test.

22. The method of claim 19, further comprising, after the self-test on the first component is completed and before initiating the first boot operation or the second boot operation, sending a message, to a safety processor of the controller, with boot mode information.

* * * * *